(12) United States Patent
Anderson et al.

(10) Patent No.: US 6,687,097 B1
(45) Date of Patent: *Feb. 3, 2004

(54) ELECTROSTATIC PROTECTION FOR MAGNETIC HEADS

(75) Inventors: Nathaniel C. Anderson, Pine Island, MN (US); Robert D. Ahmann, Rochester, MN (US)

(73) Assignee: Pemstar, Inc., Rochester, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/532,485

(22) Filed: Mar. 22, 2000

(51) Int. Cl.⁷ .................................................. G11B 5/40
(52) U.S. Cl. ....................................................... 360/323
(58) Field of Search ............................... 360/323, 244.1, 360/245.8, 245.9; 361/111, 100, 126, 220

(56) References Cited

U.S. PATENT DOCUMENTS

| | | |
|---|---|---|
| 4,726,991 A | 2/1988 | Hyatt et al. |
| 4,879,610 A | 11/1989 | Jove et al. |
| 4,977,357 A | 12/1990 | Shrier |
| 5,465,186 A | 11/1995 | Bajorek et al. |
| 5,491,605 A | 2/1996 | Hughbanks et al. |
| 5,539,598 A | 7/1996 | Denison et al. |
| 5,638,237 A | 6/1997 | Phipps et al. |
| 5,644,454 A | 7/1997 | Arya et al. |
| 5,699,212 A | 12/1997 | Erpelding et al. |
| 5,710,682 A | 1/1998 | Arya et al. |
| 5,748,412 A | 5/1998 | Murdock et al. |
| 5,757,590 A | 5/1998 | Phipps et al. |
| 5,757,591 A | 5/1998 | Carr et al. |
| 5,796,570 A | 8/1998 | Mekdhanasarn et al. |
| 5,805,390 A | 9/1998 | Takeura |
| 5,807,509 A | 9/1998 | Shrier et al. |
| 6,067,220 A | 5/2000 | Ahmann et al. |
| 6,146,813 A * | 11/2000 | Girard et al. .......... 219/121.85 |
| 6,163,443 A * | 12/2000 | Hatagami et al. ........... 360/128 |
| 6,172,590 B1 * | 1/2001 | Shrier et al. ................... 338/20 |
| 6,233,127 B1 * | 5/2001 | Shimazawa .................. 360/319 |
| 6,239,687 B1 * | 5/2001 | Shrier et al. ................... 338/20 |
| 6,310,752 B1 * | 10/2001 | Shrier et al. ................... 361/56 |

* cited by examiner

*Primary Examiner*—Carl Whitehead, Jr.
*Assistant Examiner*—Jennifer M Dolan
(74) *Attorney, Agent, or Firm*—Dorsey & Whitney LLP

(57) ABSTRACT

The present invention provides an ESD and EOS protection method and apparatus that can be easily implemented in existing disk drive designs and manufacturing process. One apparatus embodiment includes a first conductive member electrically connected to a first terminal of a magnetic head element; a second conductive member electrically connected to a first second terminal of the magnetic head element; and a variable conductive member, such as a variably conductive member. One method embodiment includes operably connecting a first conductive member to a first terminal of a magnetic head element; operably connecting a second conductive member to a second terminal of the magnetic head element; and operably connecting a variably conductive member, such as a variably conductive polymer, to the first conductive member and to the second conductive member. The variably conductive member in these embodiments acts as a conductor when a sufficiently high potential exists between the first conductive member and the second conductive member.

26 Claims, 4 Drawing Sheets

ELECTROSTATIC PROTECTION FOR MAGNETIC HEADS

FIELD OF THE INVENTION

The present invention relates to methods for protecting electrical circuits and the like from electrostatic discharges. More particularly, the present invention relates to a variably conductive polymer shunt for the protecting the read/write elements of a magnetic recording head.

BACKGROUND

Many computer systems store data on a hard disk drive. These drives generally consist of several magnetic recording disks ("hard disks") mounted to a drive spindle. The hard disks and the drive spindle are collectively referred to as a "disk stack assembly."

Hard drives store data by magnetizing portions of the disks in a pattern that represents the data. Conventional hard disk drives use several small ceramic blocks, commonly called "sliders," to magnetize surfaces of the disks. Each slider contains a "write head" that flies over the surface of the disk and magnetizes the portion of the disk immediately below it. Each slider also contains a "read head" designed to retrieve the data stored on the hard disks. These read heads produce electrical signals whenever the slider passes over a magnetic transition on the disk. These electrical signals can be used to reconstruct the stored data.

Both sides of a hard disk are generally used to store data or other information necessary for the operation of the disk drive. Thus, every disk in the stack of disks will have at least two sliders. Each slider is typically attached to a suspension assembly and to some type of electrical connector or lead assembly that provides an electrical signal pathway to and from the slider. These components, together with a suspension assembly, are collectively referred to as a head gimbal assembly ("HGA"), a head suspension assembly, or a hard file "head." The HGAs are, in turn, attached to a comb-like structure, known as an "E-block." The E-block and the HGAs are collectively known as a head stack assembly ("HSA").

The "areal density" (i.e., bits/inch×tracks/inch) of magnetic transitions on the surface of the magnetic recording disks has been increasing at a compound rate of about 60% per year. The technology requirements to read and write magnetic transitions at these densities has evolved from classic inductive devices, through magneto-resistive ("MR") devices, to today's giant magneto-resistive ("GMR") and "spin valve" devices. The hard disks have similarly evolved from aluminum platters with a "magnetic paint" coating, through highly polished electroless nickel-phosphorus ("NiP") on aluminum disks with a sputtered magnetic layer and overcoat, to "fire polished" glass with ion exchanged "case hardening" and sputtered magnetic layers—all to support the ever increasing density of transitions demanded by customers.

As the technology has advanced, disk drive manufacturers have been forced to reduce the physical size of the functional components to achieve the desired recording densities. This reduction in size, particularly of the MR and GMR devices, has progressively led to the incidences of electrostatic discharge ("ESD") damage at lower and lower threshold voltages. That is, ESD generally refers to a rapid, undesired flow of static electricity from a charged body to an uncharged body. The energy carried by an ESD event can be very damaging to the fine (i.e., small cross-section) multi-layered structures in MR and GMR head elements. By virtue of their relatively large size, the early MR devices were relatively resistant to damage by ESD events that had a voltage less than 50–100 volts. As the storage density increased, however, manufacturers needed to reduce the width and thickness of the functional (electrical and magnetic) components of the MR and GMR stripes. One consequence of this move towards smaller functional components is that the components became increasingly vulnerable to ESD damage. Accordingly, modern devices frequently display ESD damage at as little as 10–20 volts and electrical over stress ("EOS") effects upon the dissipation of as little as 0.3 nano-Joules.

This problem is compounded because, although damage from higher voltage ESD events can be detected through visual inspection, damage from lower voltage ESD and EOS events are difficult to detect. Frequently, this type of damage is only detectable after the MR/GMR head has been built into a hard file and put through final testing, which is a very expensive place to detect a manufacturing problem. In addition, EOS-damage is difficult to prevent through normal or even extraordinary ESD control measures.

There are a number of alternative MR head and ESD protection schemes which have been disclosed or patented. One scheme involves using solder to bridge a gap between the MR pads on the slider. The solder would be put down at wafer level, and removed at actuator level, so ESD damage would be eliminated for most of the manufacturing process. A laser would be used to melt the solder to open the gap, which would be done as late as possible in the manufacturing process. Some drawbacks to this method are that solder is different to use in manufacturing and that the laser removal process is not 100% reliable.

Another scheme involves connecting the MR leads together somewhere along the head gimbal assembly ("HGA") and only opening the leads when necessary for testing and for building (e.g., into an actuator). Unfortunately, the protection afforded by this scheme suffers because that the MR element is only protected for a limited portion of the manufacturing process. Thus, they do not sufficiently decrease the likelihood that a MR head will be damaged by ESD and EOS.

U.S. Pat. No. 5,748,412 to Murdock et al. ("Murdock") discloses an apparatus for protecting a magneto-resistive sensor element from electrostatic discharge. The apparatus consists of a diode assembly that exhibits a nonlinear voltage-current relationship. This diode assembly is formed using laser thermal deposition and laser induced diffusion of the necessary dopants. Despite this complex and expensive manufacturing process, the diode assembly can only protect the sensor element from discharges below 20 volts. As a result, Murdock requires other methods to protect against higher voltage ESD. Another disadvantage of Murdock is that the diodes only protect a single magneto-resistive element. Thus, a multiple-head drive using this apparatus will require several dozen pairs of diodes.

U.S. Pat. No. 5,796,570 to Mekdhanasarn et al. ("Mekdhanasarn") discloses the use of a variably conductive polymer to protect large scale electric circuits, such as printed circuit boards ("PCBs"), from high voltage ESD events. However, Mekdhanasarn does not teach the use of a variably conductive polymer to protect small-scale circuits, like those in an HGA, from low voltage ESD and EOS events. ESD protection methods used to protect large, printed circuit board sized, circuits from high voltage ESD events are different from those used to protect to small, HGA sized, circuits from low voltage ESD and EOS events. In addition, Mekdhanasarn does not teach the use of a variably conductive material made from materials known to be innocuous to hard disk drives.

Another partial solution is disclosed in copending U.S. application Ser. No. 09/054,090, filed Apr. 2, 1998 by Ahmann et al. ("Ahmann"), which is herein incorporated by reference. This application discloses a method of protecting MR/GMR devices from ESD and EOS damage through the use of a variably conductive path between the MR/GMR electrical connection pads and ground. In one embodiment, the tops or bottoms of the MR element electrical connection pads are elongated to nearly touch each other. A thin layer of a variably conductive polymer is then placed over the gap between the pads, followed by a protective overlayer. This application of a variably conductive polymer material provides ESD and EOS protection for MR and GMR type head elements from the fabrication process at the wafer or substrate level to, and including, life of the file in the final disk drive enclosure.

Although the teachings in Ahmann would be a desirable application of a variably conductive material because it provides protection during the drive's entire life cycle, Ahmann's teachings may be difficult to commercially implement. For example, the protective material in Ahmann may have to be applied to the head leads at a rather early level of the wafer processing. This location and this manufacturing requirement can lead to at least three potential problems. First, it would require the addition of several steps in an already complex and costly fabrication method. Second, these additional steps would introduce several new materials to the process cycle. These new materials may limit the invention's commercial acceptance because drive manufacturers generally require virtually irrefutable evidence that new materials would not pose any danger to the overall process and that the added materials would not be affected by any of the subsequent process steps. Third, the variably conductive material adds weight to the slider.

Accordingly, there is a need for a simple, inexpensive method of protecting magnetic head elements against high voltage ESD, low voltage ESD, and EOS damage during the drive's entire life cycle. There is also a need for a single apparatus that can protect existing HGA designs without substantial redesign and without requiring the addition of new materials into the drive enclosure or onto the slider. Also, there is a need for an ESD protection method that does not affect, and is not affected by, the processing steps necessary to make a hard drive.

SUMMARY

The present invention provides a new ESD and EOS protection method that avoids the implementation problems inherent in previous applications. This may be accomplished by the selective placement of the variably conductive material across the flex leads connecting the arm electronics to the twisted pairs of wires leading to the head, which applies protection from the HSA level. Alternatively, the variably conductive material may be applied across the conductor leads to the head, which provides protection from the HGA level. The material compatibility issues associated with conventional methods are avoided by careful selection of the materials that comprise the variably conductive material from those materials known to be innocuous when used inside the disk drive.

One aspect of the present invention is a shunt for protecting a magnetic head element having first and second terminals. One embodiment comprises a first conductive member electrically connected to the first terminal; a second conductive member electrically connected to the second terminal; and a variably conductive member electrically connected to the first conductive member and to the second conductive member. The variably conductive member in this embodiment acts as a conductor when a sufficiently high potential exists between the first conductive member and the second conductive member.

Another aspect of the present invention is an apparatus for protecting a magnetic head, one embodiment of which comprises a variably conductive shunt remotely operably connected to the magnetic head. The variably conductive shunt in this embodiment may be associated with a signal carrying element, which is operably connected to the magnetic head.

Another aspect of the present invention is a shunt for protecting a magnetic head element. One embodiment comprises a conductive member electrically connected to the magnetic head element, a system ground, and a variably conductive member electrically connected to the conductive member and to the system ground, wherein the variably conductive member conducts charge when a sufficiently high potential exists between the conductive member and the system ground.

Another aspect of the present invention is a head gimbal assembly, one embodiment of which comprises a first pad and a second pad associated with a slider member; a first conductive member electrically connected to the first pad; a second conductive member electrically connected to the second pad; and a variably conductive shunt electrically connected between the first conductive member and the second conductive member, wherein the variably conductive member conductor conducts charge when a sufficiently high potential exists between the first conductive member and the second conductive member. Some embodiments may include a plurality of first conductive members, second conductive members, and variably conductive stunts. In these embodiments, each of the first conductive members and second conductive members is electrically connected to at last one variably conductive shunt.

Another aspect of the present invention is a method of protecting a magnetic head element having first and second terminals. One embodiment comprises the act of operably connecting a first conductive member to the first terminal; operably connecting a second conductive member to the second terminal; and operably connecting a variably conductive member to the first conductive member and to the second conductive member. Operably connecting the variably conductive member to the first conductive member and to the second conductive member may include adhesively attaching a variably conductive polymer to a conductive backing and adhesively attaching the variably conductive polymer to the first conductive member and to the second conductive member. This variably conductive polymer has a relatively high impedance when a sufficiently low potential exists between the first and second terminals and wherein the variably conductive polymer has a relatively low impedance when a sufficiently high potential exists between the first and second terminals.

Another aspect of the present invention is a variably conductive tape. One variably conductive tape embodiment comprises a variably conductive layer having at least one adhesive surface. A conductive backing may be operably connected to the variably conductive layer.

One feature and advantage of the present invention is that it can provide high voltage ESD, low voltage ESD, and EOS protection throughout the drive's entire life cycle. Another feature and advantage of the present invention is that it does not add additional materials to the slider. Another feature and advantage of the present invention is that the materials used in the present invention would not be required to withstand the rigorous processing conditions encountered in the wafer level to head level processing of MR/GMR heads. These and other features, aspects, and advantages will become better understood with reference to the following description, appended claims, and accompanying drawings.

DETAILED DESCRIPTION

Figure 1A:
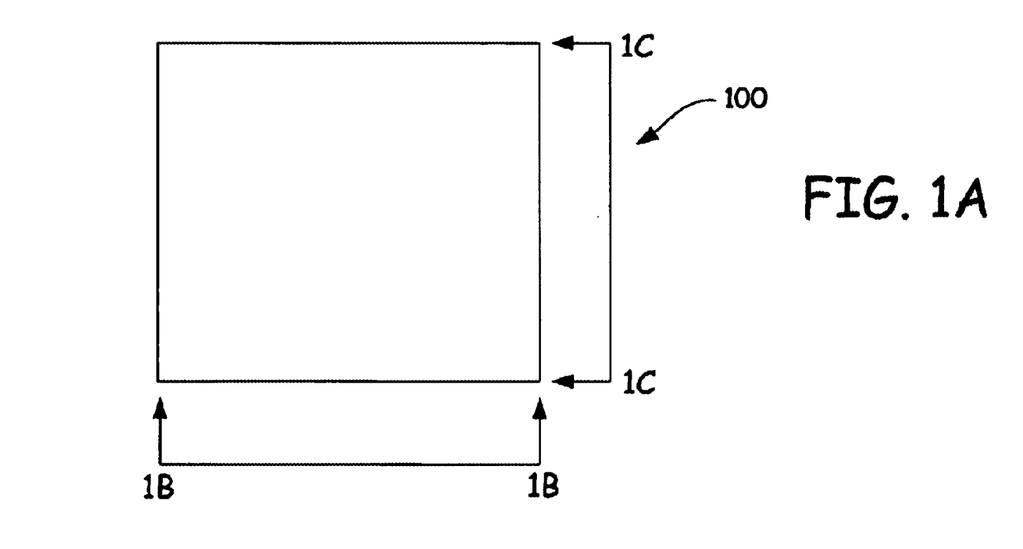
FIG. 1A is a top plan view of a slider.
Figure 1B:
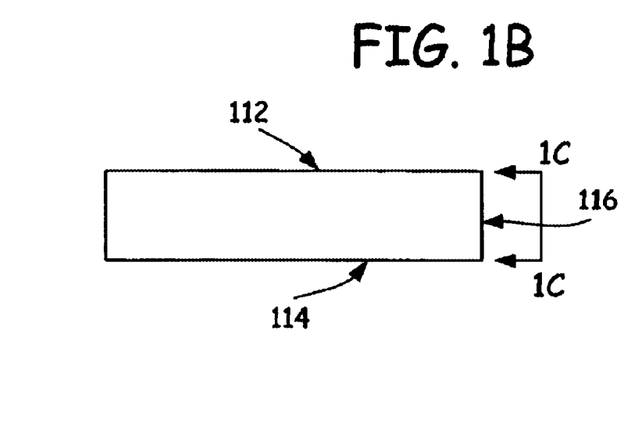
FIG. 1B is a front plan of the slider of FIG. 1A, as viewed from the line 1B—1B.
Figure 1C:
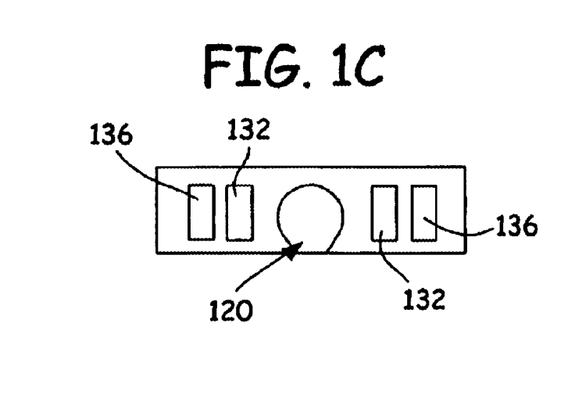
FIG. 1C is a side plan view of the slider of FIG. 1A, as viewed from the line 1C—1C.

FIGS. 1A—1C depict an industry standard 50% or 30% slider 100. This slider 100 comprises a slider member 110, a read/write sensor 120, two read element pads 132, and two write element pads 136. The slider member 110, in turn, comprises a suspension bonding surface 112, an air bearing surface 114, and a pad surface 116. In this embodiment, the read/write sensor 120 is formed integrally within slider member 110 and includes both a read element and a write element. The read element and the write element may be any devices capable of, respectively, reading and writing magnetic transitions on a hard disk. This specifically includes, without being limited to, MR elements, GMR elements, inductive elements, spin valve devices, and other ESD-sensitive and EOS-sensitive magnetic heads.

As shown in FIG. 1C, the two read element pads 132 are spaced apart from one another and mounted to the pad surface 116 of the slider member 110. Similarly, the two write element pads 136 are also spaced apart from one another and mounted to the pad surface 116. The write element of the read/write sensor 120 is electrically connected to and between the two write element pads 136. The read element of the read/write sensor 120 is similarly electrically connected to and between the two read element pads 132.

Figures 2A, 2B:
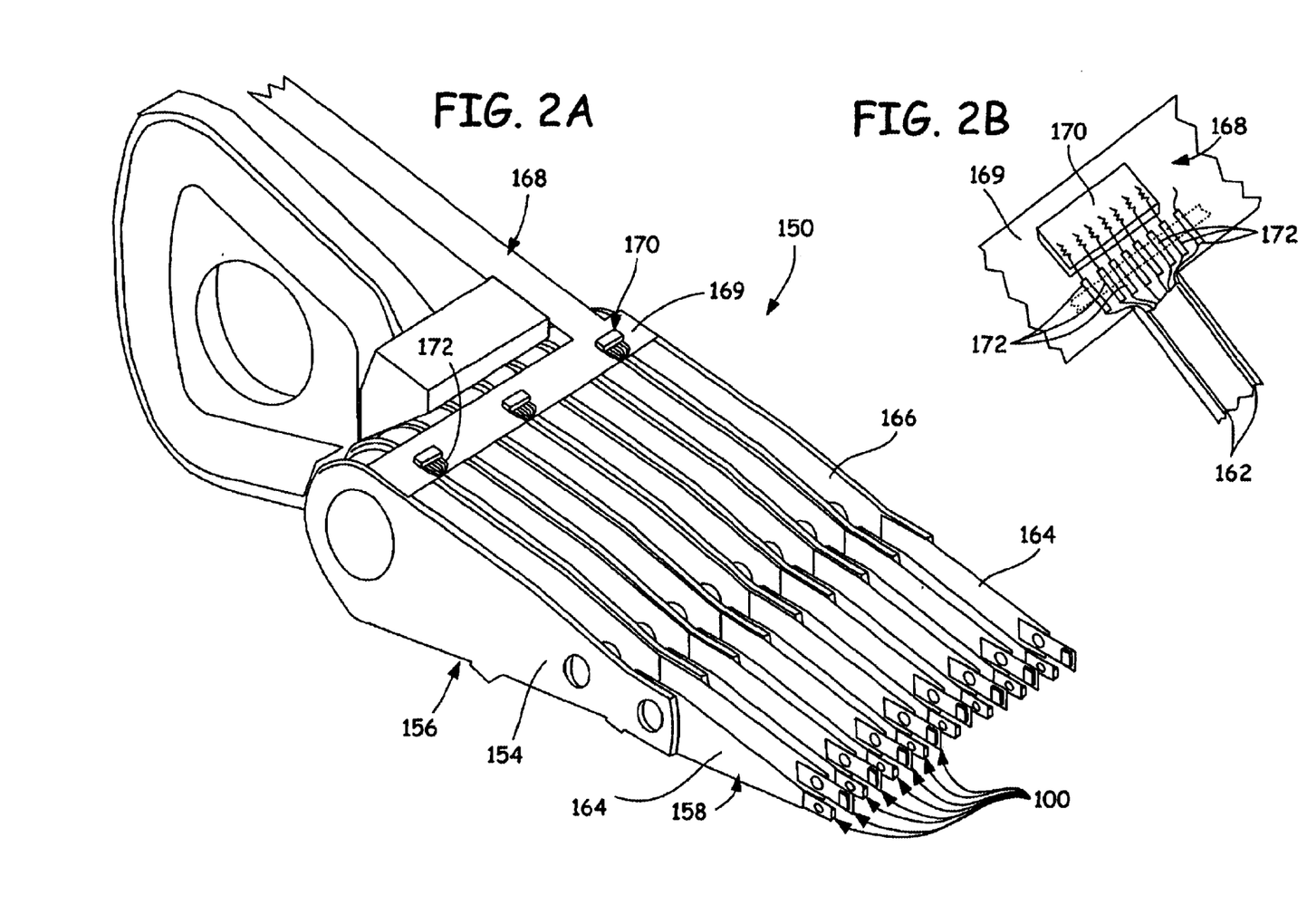
FIG. 2A is an isometric view of a head stack assembly.
FIG. 2B is a detailed isometric view of the head stack assembly in FIG. 2A, showing one location for a variably conductive shunt.

FIG. 2A is an isometric view of a head stack assembly ("HSA") 150 embodiment. This HSA 150 embodiment comprises sixteen sliders 100, with each slider 100 being fixedly mounted to an arm 154 of an E-block 156 by a suspension assembly 158. The HSA 150 also comprises a plurality of twisted wire pairs 162, a suspension edge 164, an E-block arm edge 166, and a primary flex circuit 168. The primary flex circuit 168, in turn, includes a plurality of arm electronics ("AE") modules 170 that are linearly spaced along a transverse portion 169 of the flex circuit 168.

FIG. 2B is a detailed isometric view of a portion of the primary flex circuit 168 surrounding one of the AE modules 170. Each AE module 170 is electrically connected to a plurality of AE connection pads 172, which are linearly spaced along one edge of the transverse portion 169 of the primary flex circuit 168. These connection pads 172 are, in turn, connected to the slider's read or write pads 132, 136 by the twisted wires pairs 162. In this embodiment, each connection pad 172 is electrically connected to exactly one read or write element pad 132, 136. Accordingly, each slider 100 has two twisted wire pairs 162 that run from its read and write element pads 132, 136, along the suspension edge 164 and the arm edge 166, to the AE connection pads 172. Thus, the sixteen head HSA depicted in FIG. 2A will have thirty-two twisted wire pairs 162 leading to sixty-four connection pads 172.

FIG. 2B also shows, in dashed lines, one suitable location for a variably conductive shunt 174. The variably conductive shunt 174 in this embodiment is physically applied across all sixty-four connection pads 172 in a generally rectangular strip. However, other locations and shapes are within the scope of the present invention.

In operation, the variably conductive shunt 174 has a high impedance (i.e., high enough not to adversely affect the operation of the read and write elements) when subjected to voltages below a certain "breakdown" or "tunneling" voltage. At voltages above this breakdown voltage, however, the shunt 174 conducts charge with very low impedance. That is, the variably conductive shunt 174 behaves like an open circuit at low voltages and a short circuit at high voltages. Accordingly, the variably conductive shunt 174 prevents a voltage difference from building up between the shunted electrical conductors that is greater than the shunt's 174 breakdown voltage.

The variably conductive shunt 174 may comprise any material having a breakdown voltage that is lower than that voltage differential necessary to generate a harmful ESD or EOS event. Preferably, however, the breakdown voltage should be somewhere between the voltage at which ESD and/or EOS would cause a degradation of some aspect of the head's magnetic performance and the voltage at which the head transmits its electrical information.

One suitable variably conductive shunt 174 is a variably conductive polymer or composite matrix, such as those sold under the trademarks "SurgX" or "SurgTape" by SurgX, Inc. and Electric Polymers, Inc., both of Fremont, Calif. However, other variably conductive materials are also within the scope of the present invention, including without limitation, back-to-back diodes and the materials described in U.S. Pat. No. 5,807,509 to Shrier et al., U.S. Pat. No. 3,685,026 to Wakabayashi et al., U.S. Pat. No. 4,977,357 to Shrier, and U.S. Pat. No. 4,726,991 to Hyatt et al. These patents are each incorporated by reference in their entirety. It is also desirable that the chosen variably conductive shunt 174 comprise materials that are will not affect the other components inside the disk drive. Thus, the silicone-rubber binder used in some SurgX or SurgTape embodiments is replaced by a 'safe' adhesive, such as epoxy, that is commonly accepted as being compatible with the other materials, processes, and devices used in the drive industry. These embodiments are desirable because the silicon-rubber based variably conductive shunts 174 may outgas inside the drive enclosure, which can cause problems with hazing, stiction, and mechanical durability.

Figure 3A:
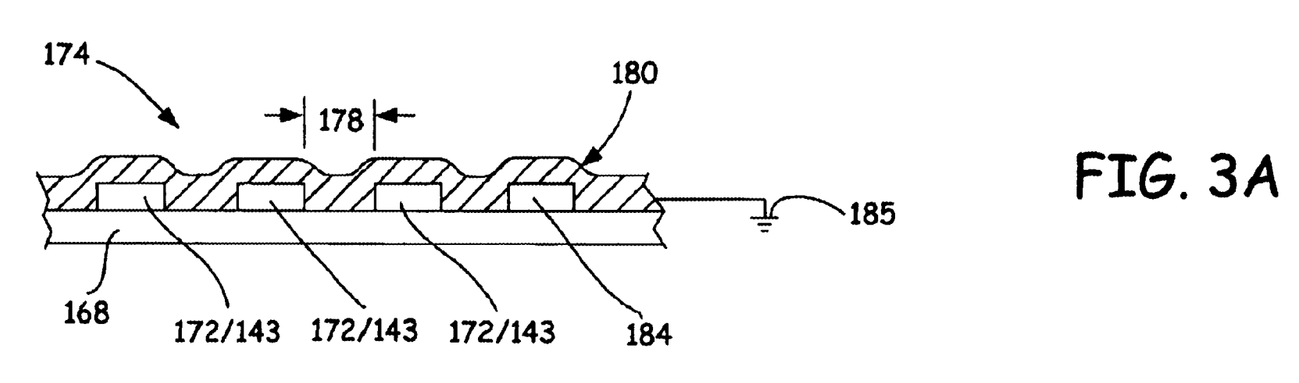
FIG. 3A is a fragmentary cross section of a variably conductive shunt embodiment that is applied in liquid or gel form.
Figure 3B:
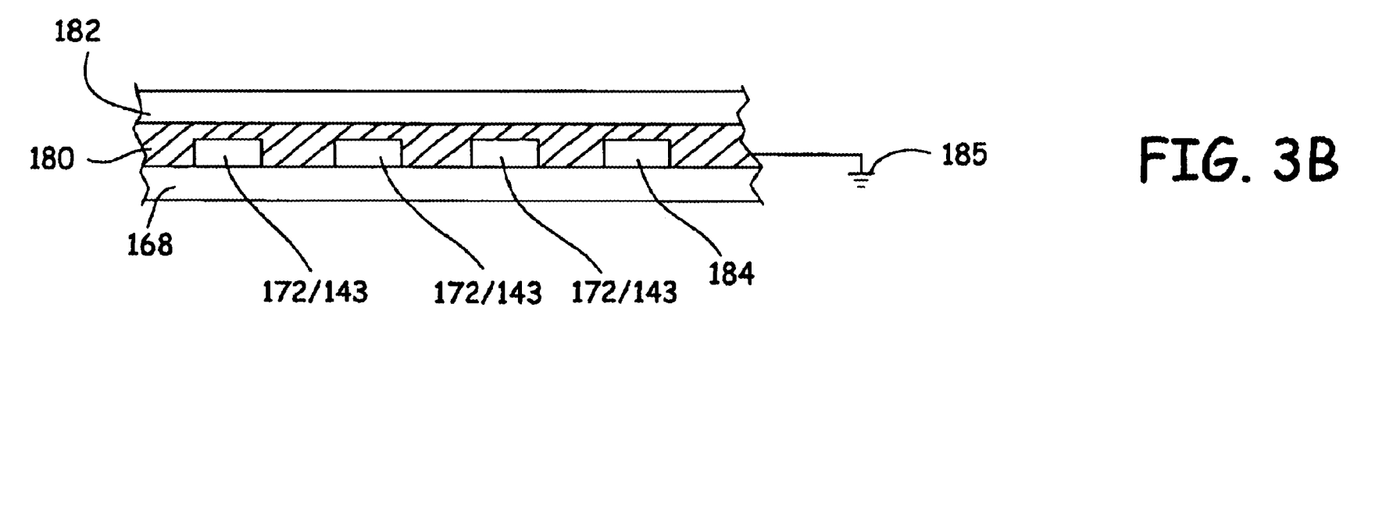
FIG. 3B is a fragmentary cross section of a variably conductive shunt embodiment that is applied in tape form.

FIGS. 3A and 3B are fragmentary cross-sectional views of an embodiment in which the shunt 174 comprises a variably conductive polymer that has been formulated to exhibit a threshold and clamping voltage less than that which would damage the particular type of head with which it is used. In FIG. 3A, the variably conductive material 180 is applied as a liquid suspension or gel using any suitable means, such as silk screening, then cured in place. These embodiments may be desirable because of their ease in obtaining good electrical contact between the shunt material 180, the pads 172, and/or the conductors 143. In FIG. 3B, the variably conductive material 180 is formulated to have adhesive properties (in addition to its variably conductive attributes) or has been coated with an adhesive material. In these embodiments, the variably conductive material 180 is first formed into a generally rectangular strip ("tape"), then is adhesively attached to a conductive metal foil 182. The variably conductive tape is then adhesively attached to the pads 172 and/or the conductors 143. These embodiments may be desirable because it is quick, simple, and inexpensive to apply the shunt 174, and because the tape form helps to ensure uniform shunt dimensions.

As also shown in FIGS. 3A and 3B, some shunt 174 embodiments may be electrically grounded. One suitable method of grounding the shunt 174 is to have the shunt 174 span one or more system ground pads 184, in addition to the pads 172 and/or the conductors 143, or to embed a grounded conductor in the variably conductive material 180. In this manner, electrical charge on either the pads 172 and/or conductors 143 can flow through the variably conductive shunt 174 to the system ground 185. Another suitable method of grounding the shunt 174, particularly those embodiments in which the shunt 174 is applied in tape form, is to attach a grounded conductive element to the conductive foil backing 182. These embodiments may be desirable because the metal foil backing 182 helps to ensure a good electrical connection between the system ground and the pads/conductors. In addition, those skilled in the art will recognize that FIGS. 3A and 3B are intended to be a schematic representations of various concepts and should not necessarily be construed as a specific example of application.

Figures 4A, 4B, 4C:
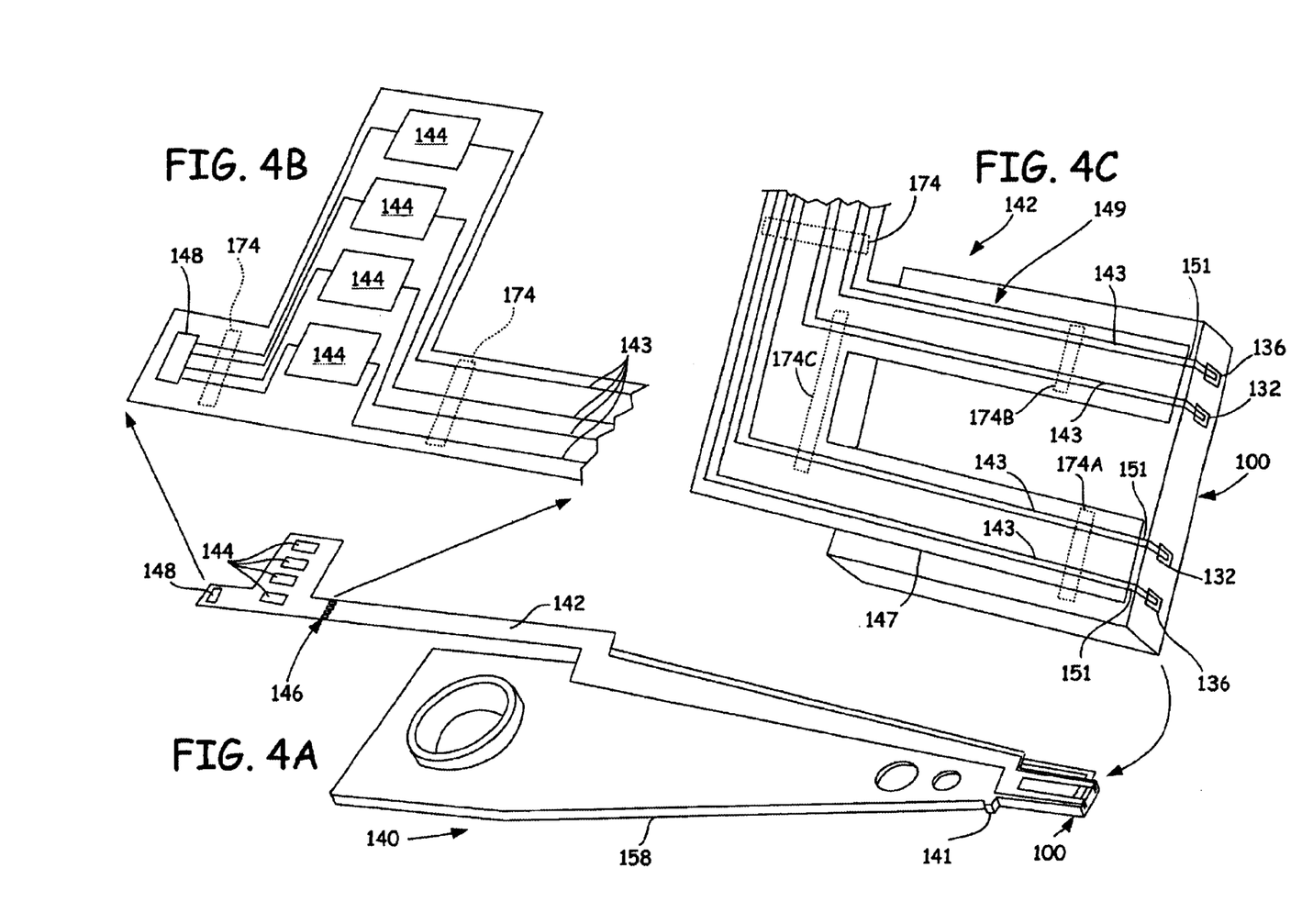
FIG. 4A is an isometric view of a head gimbal assembly.
FIG. 4B is a detailed isometric view of the area in FIG. 4A surrounding the FOS leads.
FIG. 4C is a detailed isometric view of the area in FIG. 4A surrounding the slider, with the gimbal removed for clarity.

FIGS. 4A–4C are isometric views of a flex-on-suspension ("FOS") style HGA 140 embodiment that is protected using a variably conductive shunt 174. This HGA 140 comprises a FOS 142, a suspension 158, a gimbal 141, and a slider 100. As best shown in FIG. 4C, the FOS 142 in this embodiment splits into a left arm 147 and a right arm 149. The left arm 147 and the right arm 149 each contain two conductors 143 that are, respectively, electrically connected to the write element pads 136 and the read element pads 132 by conductor tabs 151. As best shown in FIG. 4B, the opposite end of the conductors 143 are electrically connected to a plurality of linearly-spaced test connection contact surfaces ("probe pads") 144 and a plurality of linearly-spaced primary circuit connection surfaces 146 ("leads"). The FOS 142 in some embodiments may also comprise a removable shunt 148 that can temporarily electrically couple together the four conductors 143 before the variably conductive shunt 174 is applied.

FIG. 4B shows two alternate locations for the variably conductive shunt 174. In one embodiment, the shunt 174 is physically applied across the conductors 143 at a location between the probe pads 144 and the removable shunt 148. In the other embodiment, the shunt 174 is physically applied across the conductors at a location between the probe pads 144 and the FOS leads 146.

FIG. 4C shows two additional locations for the variably conductive shunt 174. The variably conductive shunt 174 in one embodiment is physically applied across all four conductors at a point near where the slider 100 connects to the suspension 158 and would protect both the read and write heads. The shunt 174 in the other embodiment comprises three variably conductive strips, labeled 174A, 174B, and 174C, respectively. Shunt 174A is physically placed across the two conductors 143 in the left arm, the shunt 174B is physically placed across the two conductors 143 in the right arm 149, and the shunt 174C is physically applied across the inside conductor 143 in the left arm 147 and the inside conductor 143 in the right arm 149. These locations may be desirable because the variably conductive members are located in close proximity to the slider 100. Shunts 174A–174C may also be used individually or in pairs. For example, drive manufacturers may use shunts 174A and 174B as a pair to protect the read and write heads, or may use shunt 174C by itself if protection is only needed for the read heads.

Although the present invention has been described in detail with reference to certain examples thereof, it may be also embodied in other specific forms without departing from the essential spirit or attributes thereof. For example, those skilled in the art will recognize that the embodiments in FIGS. 2B–2C and 4B–4C can be used by themselves or can be combined to provide additional protection. That is, although each variably conductive shunt 174 embodiment is capable of protecting the magnetic heads, some additional or backup protection may be provided by placing shunts 174 at more than one location. The cost of this additional protection, however, should be balanced against its additional cost and complexity. The shunt 174 may also be coated with a protective overlayer in some embodiments. This overlayer can be any substance, such as an epoxy sealant, that can help protect the shunt 174 and that is compatible with various manufacturing and operational environments associated with the internal components of the hard drive. In addition, the present invention may be easily extended to other technology for fabricating HGAs, specifically including without being limited to, flex-suspension-assemblies ("FSA").

The present invention offers many advantages over conventional methods of protecting a hard disk drive from ESD and EOS damage. For example, the present invention provides a simple, inexpensive method of protecting existing HGA designs that can also be easily adapted to more advanced HGA designs, such as FOS and FSA. The present invention also provides an ESD and EOS protection method that is not affected by, and does not affect, the processing steps necessary to make a hard drive. In addition, the present invention provides an ESD and EOS protection method that does not add weight to the slider, that protects during the drive's entire life cycle, and that does not affect the durability of other hard drive components.

Those skilled in the art will recognize that the accompanying figures and this description depicted and described embodiments of the present invention, and features and components thereof. With regard to means for fastening, mounting, attaching or connecting the components of the present invention to form the mechanism as a whole, unless specifically described otherwise, such means were intended to encompass conventional fasteners such as machine screws, nut and bolt connectors, machine threaded connectors, snap rings, screw clamps, rivets, nuts and bolts, toggles, pins, and the like. Components may also be connected by welding, soldering, brazing, friction fitting, adhesives, or deformnation, if appropriate. Unless specifically otherwise disclosed or taught, materials for making components of the present invention were selected from appropriate materials, such as metal, metallic alloys, fibers, polymers, and the like; and appropriate manufacturing or production methods, including casting, extruding, molding, and machining, may be used. In addition, any references to front and back, right and left, top and bottom and upper and lower were intended for convenience of description, not to limit the present invention or its components to any one positional or spacial orientation. Therefore, it is desired that the embodiments described herein be considered in all respects as illustrative, not restrictive, and that reference be made to the appended claims for determining the scope of the invention.

We claim:

1. A shunt for protecting a magnetic head assembly having first and second terminals and an arm electronic module, the shunt comprising:
   (a) a first conductive member electrically connected to the first terminal and to an arm electronic module;
   (b) a second conductive member electrically connected to the second terminal and to the arm electronic module; and
   (c) a variably conductive polymer electrically connected to the first conductive member and to the second conductive member, wherein the variably conductive polymer acts as a conductor when a sufficiently high potential exists between the first conductive member and the second conductive member.

2. The shunt of claim 1, wherein the sufficiently high potential is less than a potential sufficient to damage the magnetic head element.

3. The shunt of claim 1, wherein the variably conductive polymer is physically disposed between the first conductive member and the second conductive member.

4. The shunt of claim 1, wherein the variably conductive polymer is physically connected adjacent to the first and second terminals.

5. The shunt of claim 1, wherein the variably conductive polymer is physically disposed adjacent to the arm electronic module.

6. The shunt of claim 1, wherein said variably conductive polymer comprises an epoxy binder.

7. The shunt of claim 1, wherein the variably conductive polymer is applied as a liquid suspension.

8. The shunt of claim 1, wherein the variably conductive polymer is operably connected to a conductive backing.

9. The shunt of claim 1, wherein the variably conductive polymer is adhesively attached to the first conductive member and to the second conductive member.

10. The shunt of claim 1, wherein the variably conductive polymer is applied as a tape.

11. The shunt of claim 1, wherein the magnetic head element is chosen from the group consisting of an inductive element, a magneto restrictive element, a giant magneto restrictive element, and a spin valve element.

12. The shunt of claim 1, wherein the variably conductive polymer is electrically connected to a system ground.

13. The shunt of claim 12, wherein the variably conductive polymer serves as a conductor when a sufficiently high potential exists between the first conductive member and the system ground.

14. The shunt of claim 1, wherein the variably conductive polymer acts as an electrical insulator where a sufficiently low potential exists between the first conductible member and the second conductive member.

15. A shunt for protecting a head gimbal assembly having a probe pad and magnetic head element, the shunt comprising:
   a conductive member electrically connected to a magnetic head element and a probe pad;
   a system ground; and
   a variably conductive polymer electrically connected to the conductive member and to the system ground, wherein the variably conductive member conducts charge when a sufficiently high potential exists between the conductive member and the system ground.

16. The shunt of claim 15, wherein the sufficiently high potential is less than a potential necessary to damage the magnetic head element.

17. A head gimbal assembly, comprising:
   a first conductive member coupling a first pad to a magnetic head element;
   a second conductive member coupling a second pad to the magnetic head element; and
   a variably conductive polymer electrically connected between the first conductive member and the second conductive member, wherein the variably conductive member conductor conducts charge when a sufficiently high potential exists between the first conductive member and the second conductive member.

18. The head gimbal assembly of claim 17, further comprising a system ground and wherein the variably conductive polymer conducts charge to the system ground when a sufficiently high potential exists between the first pad and the system ground.

19. The head gimbal assembly of claim 17, wherein the first conductive member and the second conductive member are associated with a flexible circuit.

20. The head gimbal assembly of claim 17, further comprising a plurality of first conductive members, second conductive members, and variably conductive polymers; and wherein each of the first conductive members and second conductive members is electrically connected to at last one variably conductive polymer.

21. A method of protecting a magnetic head element having first and second terminals, comprising:
   operably connecting a first conductive member between an arm electronic module and a first terminal;
   operably connecting a second conductive member between an arm electronic module and a second terminal; and
   operably connecting a variably conductive polymer to the first conductive member and to the second conductive member.

22. The method of claim 21, wherein the variably conductive polymer is physically disposed between the first conductive member and the second conductive member.

23. The method of claim 21, wherein the act of operably connecting the variably conductive polymer to the first conductive member and to the second conductive member comprises the acts of:
   applying a liquid suspension over the first conductive member and the second conductive member; and
   curing the liquid suspension.

24. The method of claim 21, wherein the act of operably connecting the variably conductive polymer to the first conductive member and to the second conductive member comprises the act of:
   adhesively attaching the variably conductive polymer to a conductive backing; and adhesively attaching the variably conductive polymer to the first conductive member and to the second conductive member.

25. The method of claim 21, wherein the variably conductive polymer has a relatively high impedance when a sufficiently low potential exists between the first and second terminals and wherein the variably conductive polymer has a relatively low impedance when a sufficiently high potential exists between the first and second terminals.

26. The method of claim 21, further comprising operably connecting the variably conductive polymer to a system ground.

* * * * *

UNITED STATES PATENT AND TRADEMARK OFFICE
CERTIFICATE OF CORRECTION

PATENT NO.    : 6,687,097 B1
DATED         : February 3, 2004
INVENTOR(S)   : Nathaniel C. Anderson et al.

It is certified that error appears in the above-identified patent and that said Letters Patent is hereby corrected as shown below:

<u>Title page,</u>
Item [75], Inventors, should read -- Nathaniel C. Anderson, Pine Island, MN (US); Robert D. Ahmann, Rochester, MN (US); Mark E. Troutman, Rochester, MN (US) --
Item [57], ABSTRACT, should read -- The present invention provides an ESD and EOS protection method and apparatus that can be easily implemented in existing disk drive designs and manufacturing processes. One apparatus embodiment includes a first conductive member electrically connected to a first terminal of a magnetic head element; a second conductive member electrically connected to a second terminal of the magnetic head element; and a variably conductive member, such as a variably conductive polymer, that is electrically connected to the first conductive member and to the second conductive member. One method embodiment includes operably connecting a first conductive member to a first terminal of a magnetic head element; operably connecting a second conductive member to a second terminal of the magnetic head element; and operably connecting a variably conductive member, such as a variably conductive polymer, to the first conductive member and to the second conductive member. The variably conductive member in these embodiments acts as a conductor when a sufficiently high potential exists between the first conductive member and the second conductive member. --

Signed and Sealed this

Thirteenth Day of April, 2004

JON W. DUDAS
*Acting Director of the United States Patent and Trademark Office*